United States Patent [19]
Yokouchi

[11] Patent Number: 4,641,109
[45] Date of Patent: Feb. 3, 1987

[54] CMOS CRYSTAL CONTROLLED OSCILLATOR

[75] Inventor: Hiroshi Yokouchi, Tokyo, Japan

[73] Assignee: OKI Electric Industry Co., Ltd., Tokyo, Japan

[21] Appl. No.: 807,877

[22] Filed: Dec. 11, 1985

[30] Foreign Application Priority Data

Dec. 12, 1984 [JP] Japan ................................ 59-260882

[51] Int. Cl.$^4$ ............................................. H03B 5/30
[52] U.S. Cl. ............................. 331/116 FE; 331/160; 368/159
[58] Field of Search ............. 331/116 FE, 116 R, 158, 331/159, 160; 368/156, 159, 219

[56] References Cited

FOREIGN PATENT DOCUMENTS 0117311  9/1980  Japan ............................ 331/116 FE Primary Examiner—Eugene R. LaRoche
Assistant Examiner—Robert J. Pascal
Attorney, Agent, or Firm—Wenderoth, Lind & Ponack

[57] ABSTRACT

A CMOS crystal controlled oscillator includes a CMOS inverter composed of series connected MOS FETs and a crystal connected between signal input an output nodes of the inverter. First and second capacitors are respectively connected between the signal input and output nodes of the inverter and a feedback resistor is connected between the signal input and output nodes of the inverter. A first current limiting circuit is connected between a MOS FET of the inverter and a power source potential and a second limiting circuit is connected between another MOS FET of the inverter and a ground potential. A control register is provided for controlling the first and second current limiting circuits based on data contained within an internal data bus.

5 Claims, 7 Drawing Figures

HIGH FREQUENCY OSCILLATION WAVEFORM (A)
LOW FREQUENCY OSCILLATION WAVEFORM (B)

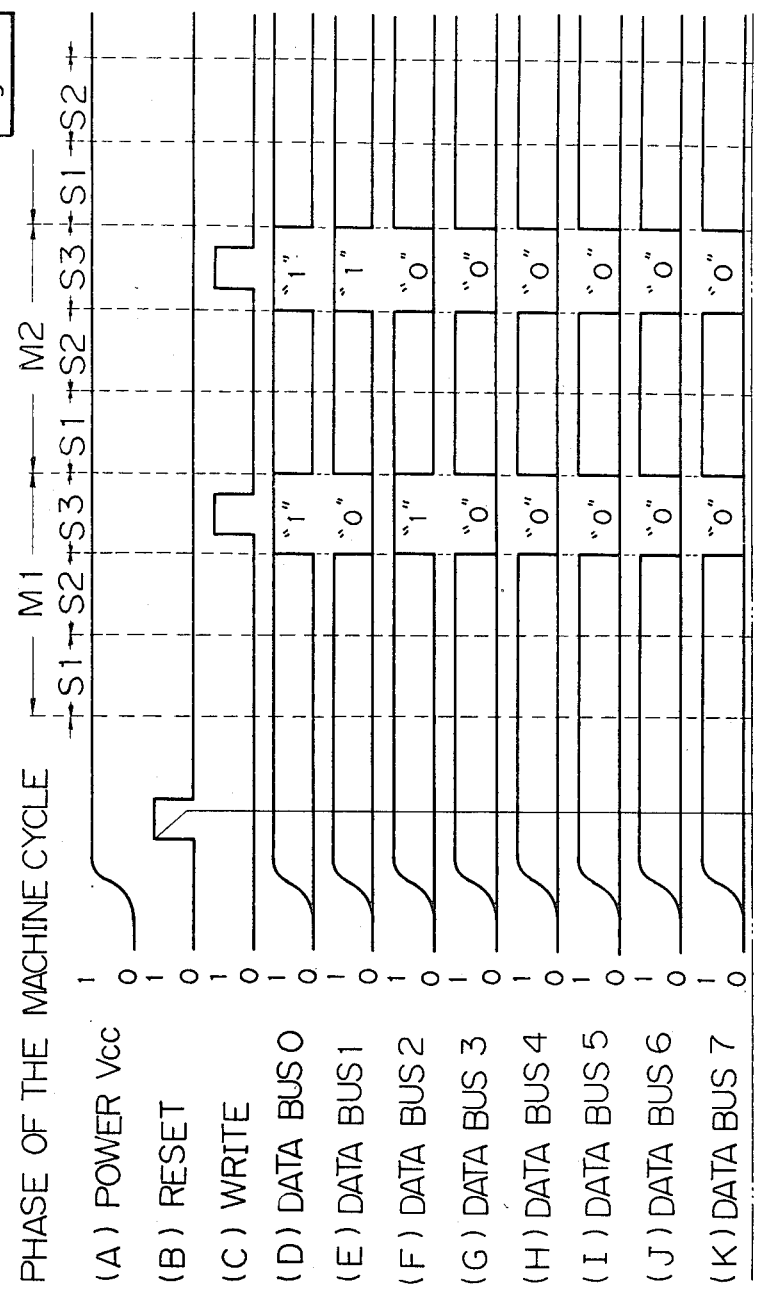

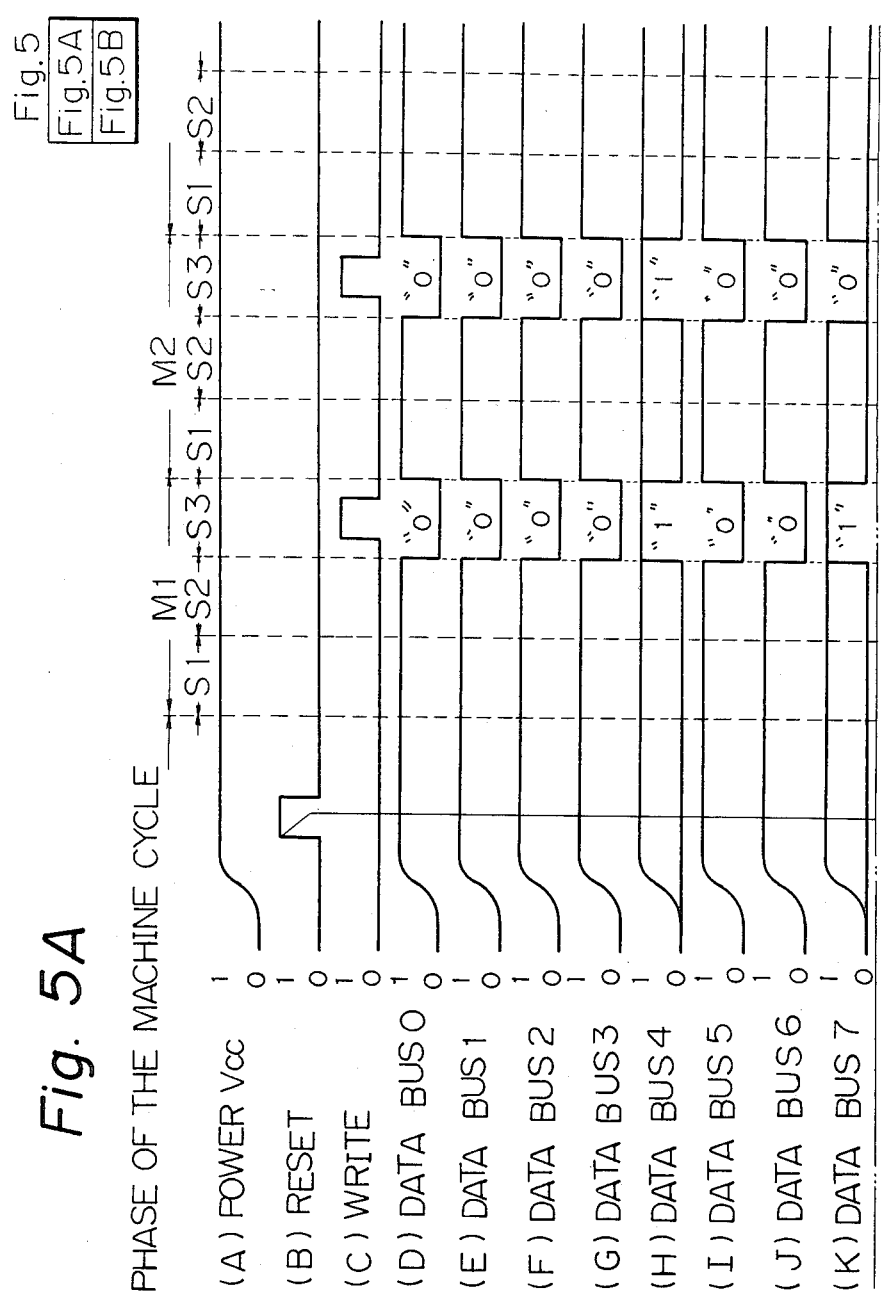

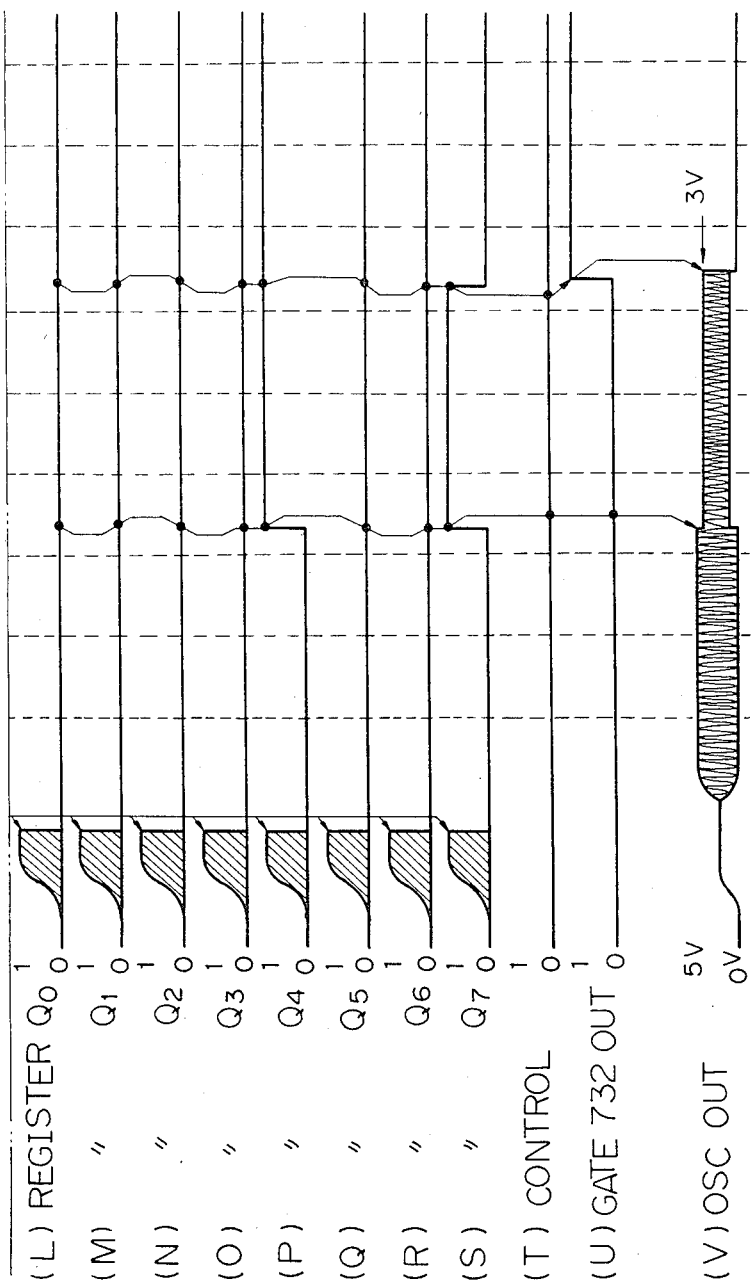

CMOS CRYSTAL CONTROLLED OSCILLATOR

BACKGROUND OF THE INVENTION

1. Field of the invention

The present invention relates to a CMOS crystal controlled oscillator.

2. Description of the Prior Art

A CMOS crystal controlled oscillator is essential to microprocessors and microcomputers as a clock source thereof.

A CMOS oscillator comprises a CMOS inverter, a crystal element, a capacitor and a feedback resistor, and is operatable with low power consumption. One such oscillator is disclosed in U.S. Pat. No. 3,676,801 in detail.

To further decrease the power consumption of the CMOS crystal control oscillator, resistors R1 and R2 are additionally added thereto for limiting an operation current of a CMOS inverter, as shown in FIG. 2.

In a CMOS oscillator of this type, the CMOS inverter and the feedback resistor are formed on a semiconductor substrate as a chip, and a crystal element is connected with a terminal of an IC package as an external part.

A circuit constant of the CMOS oscillator in the IC chip is usually designed such that the oscillator is operated at the maximum frequency of oscillation with the minimum power as shown in (A) of FIG. 3. Accordingly, provided that the oscillator is needed to generate a low frequency clock signal with use of a low frequency crystal element, it is feared that it oscillates at a doubled frequency of the clock signal. In addition, since the voltage amplitude of the clock signal is increased as shown in waveform (B) of FIG. 3, the oscillator requires a higher power consumption.

Particularly, upon operating a high-speed microprocessor or microcomputer with use of a low frequency oscillation signal as a clock, a current-limiting resistance does not satisfactorily exert its effect and causes the power consumption of the oscillator to be increased. Furthermore, improper selection of a current-limiting resistance value may cause the osillator to oscillate at a doubled frequency.

SUMMARY OF THE INVENTION

It is an object of the present invention to provide a CMOS crystal controlled oscillator capable of generating an oscillation frequency over a wide range with reduced power consumption and with little variations in starting time of the oscillation.

Another object of the present invention is to provide a CMOS crystal controlled oscillator capable of optionally changing a current-limiting resistance value based on data stored in a register.

Still another object of the present invention is to provide a CMOS crystal controlled oscillator having a reduced influence on an oscillation characteristic of the oscillator upon changing a quartz element thereof.

According to the present invention, the CMOS crystal controlled oscillator comprises a CMOS inverter composed of serially connected P and N type MOS FETs, a quartz crystal element connected between the signal input and output of the CMOS inverter, a first capacitor connected between the signal input part of the CMOS inverter and a ground potential, a second capacitor connected between the signal output of the CMOS inverter and the ground potential, a feedback resistor connected between the signal input and output of the CMOS inverter for providing a DC bias potential to the CMOS inverter, a first current-limiting circuit connected between the P type MOS FET of the CMOS inverter and a power source potential for limiting a current through the CMOS inverter, a second current-limiting circuit connected between the N type MOS FET of the CMOS inverter and the ground potential for limiting a current flowing through the CMOS inverter, and a control register for controlling the first and second current-limiting circuits based on the contents of an internal data bus to reduce power consumption.

With the circuit arrangement according to the present invention, data on the internal data bus for optimizing oscillation operation of the crystal control oscillator is written into a register, and a resistive component of the current-limiting circuit connected with the CMOS inverter is selected based on output data from the register to optimize an oscillation current.

The above and other objects, features and advantages of the invention will be more apparent from the ensueing detailed description taken in conjunction with the accompanying drawings.

BRIEF DESCRIPTION OF THE DRAWINGS

FIGS. 4A–4B are a view showing operation timing of the CMOS crystal controlled oscillator with use of a 12 MHz quartz element.

FIGS. 5A–5B are a view showing operation timing of the CMOS crystal control oscillator with use of a 50 KHz quartz element.

DESCRIPTION OF THE PREFERRED EMBODIMENT

Figure 1:
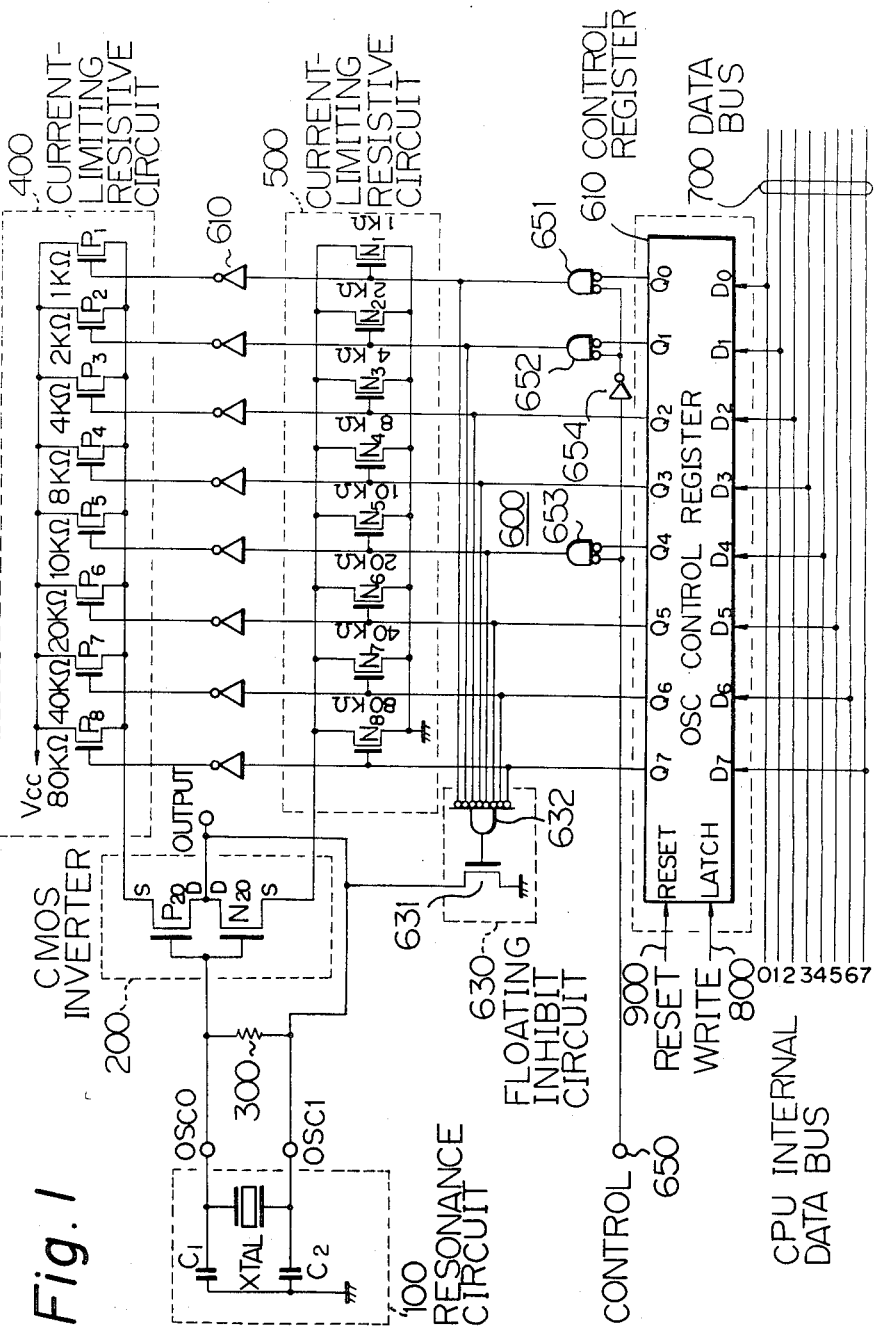
FIG. 1 is a circuit block diagram showing a CMOS crystal controlled oscillator according to the present invention.
Figure 2:
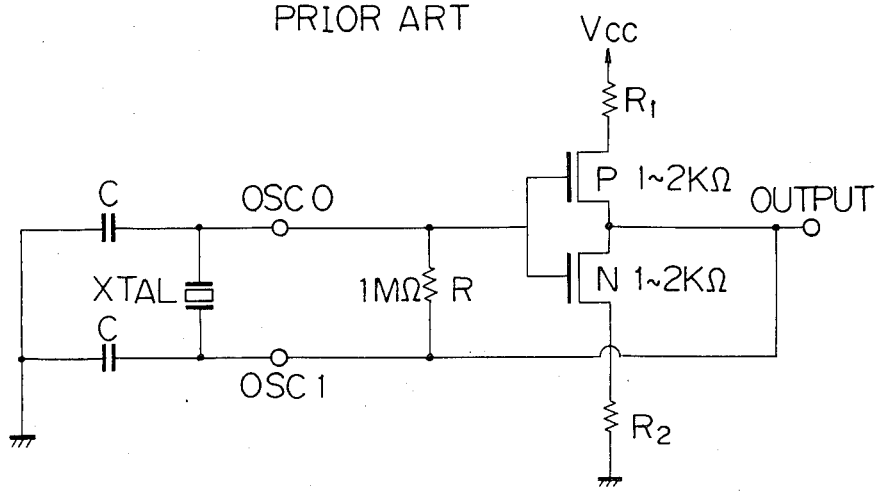
FIG. 2 is a circuit block diagram showing a prior CMOS crystal oscillator.
Figure 3:
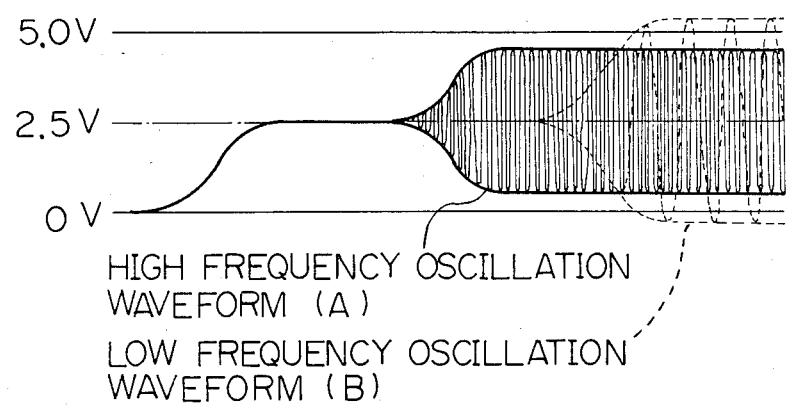
FIG. 3 is a view illustrating an oscillation characteristic of the prior CMOS crystal controlled oscillator.

As shown in FIG. 1, a CMOS crystal controlled oscillator according to the present invention includes an external crystal resonance circuit 100 connected between external pin terminals OSC 0 and OSC 1, a CMOS inverter 200 formed in a microprocessor IC, a feedback register 300 connected with the CMOS inverter and the external pin terminals OSC 0 and OSC 1 for supplying a DC bias potential to the CMOS inverter 200, current-limiting circuits 400 and 500 for reducing an operation current, and a control circuit 600.

The resonance circuit 100 has therein a crystal element XTAL and two 50 PF, for example, bias capacitors, $C_1$ and $C_2$. The capacitor $C_1$ may be formed in the IC chip.

The CMOS inverter 200 includes the P and N type MOS FETs each having gate electrodes connected in common with the external pin terminal OSC 0 while having drain electrodes connected in common with the external pin terminal OSC 1.

The feedback resistor 300 is connected between signal input and output parts of the CMOS inverter 200, which comprises, for example, an 1 MΩ diffused resistor or MOS resistor.

The current-limiting resistive circuit 400 comprises a plurality of P type MOS FETs $P_1$ to $P_8$ each having source electrodes connected in common with a power source potential $v_{cc}$ (for example, 5 V) while having drain electrodes connected in common with a source electrode of a P type MOS FET P20. The MOS FETs $P_1$ to $P_8$ respectively have on-resistances of, for example, 1, 2, 4, 8, 10, 20 and 80 KΩ.

The current-limiting resistive resistor 500 comprises a plurality of N type MOS FETs $N_1$ to $N_8$ each having source electrodes connected in common with a source electrode of an N type MOS FET N20 while having drain electrodes of an N type MOS FET connected in common with the ground potential. The MOS FETs $N_1$ to $N_8$ include respectively on resistances of 1, 2, 4, 8, 10, 20, 40 and 80 KΩ.

The control circuit 600 serves to select the optimim current-limiting resistance for low power consumption operation based on a program instruction provided on the internal data bus 700.

The control circuit 600 temporarily stores data on the data bus 700 with use of a write signal 800 and includes a control register 610 for controlling the current-limiting resistive circuits 400 and 500 and an inhibit circuit 630 for preventing the signal output part of the CMOS inverter 200 from floating due to output data from the control resister 610 as a microprocessor internal circuit is switched to a power-down mode.

The inhibit circuit 630 comprises, for example, an N type MOS FET 631 and an NOR circuit 632 for permitting the MOS FET 631 to conduct due to output data from a register 710, e.g., 00000000.

NOR circuits 651, 652 and 653 and an inverter 654 serve to refine an oscillation starting characteristic, and to select the MOS FETs $P_1$ and $P_2$, and $N_1$ and $N_2$ (internal resistances 1 and 2 kΩ, respectively) upon entering a "H" level signal on a control terminal when, for example, a high frequency crystal element is connected between the pin terminals OSC 0 and OSC 1, or to select the MOS FETs $P_5$ and $N_5$ (internal registance 20 kΩ) upon entering a "L" level signal on the control terminal 650 when a low frequency crystal element is connected between the pin terminals OSC 0 and OSC 1.

Operation of the CMOS crystal controlled oscillator according to the present invention will be described with reference to the timing chart shown in FIGS. 4A-4B.

A high frequency operation (e.g. 12 MHz) crystal element is assumed to be connected between the terminals OSC 0 and OSC 1.

Figure 4B:
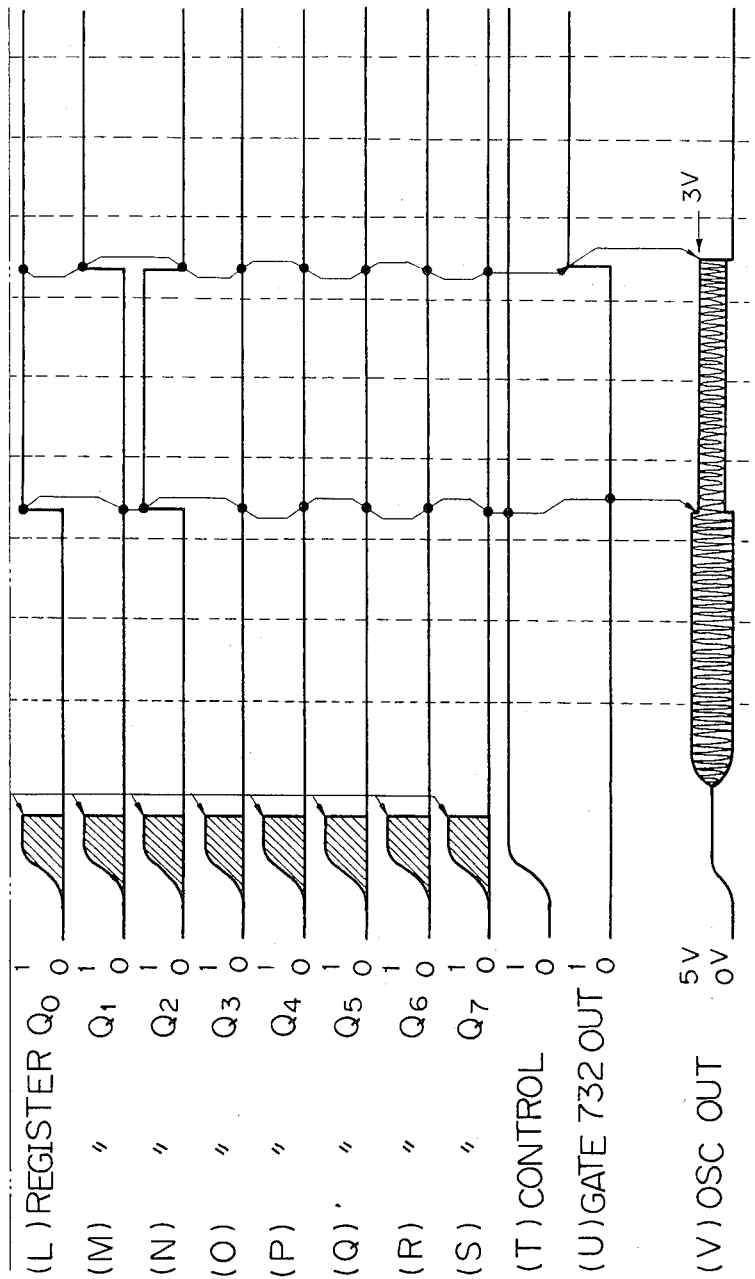

At the moment that a 5 V supply voltage is applied to the microprocessor IC (see waveform (A) of FIG. 4A), outputs from the CPU internal data bus 700 and the control register 610 are unstable. Applying here a CPU reset signal (not shown), a reset signal 900 becomes a "1", whereby the outputs from the register 610 are initialized to 00000000 (refer to waveforms (B), (L), (M), (N), (0), (P), (Q), (R) and (S) of FIGS. 4A-4B). Then, a logic "1" signal is applied to the terminal 650, and thereby the NOR circuits 651, 652 provide a "1" level logical signal to permit the MOS FETs $P_1$ and $P_2$, and $N_1$ and $N_2$ to conduct. The CMOS inverter 200 is biassed with $V_{DD}/2$ voltage, for thereby starting to oscillate gradually to provide a 5 V clock signal (refer to waveform (V) of FIG. 4(B).

In succession, the CMOS inverter 200 delivers, for example, data 00000101 to the data bus 700 in a phase S3 of a machine cycle M1 owing to a program instruction for selecting current-limiting resistance to operate the inverter 200 in the minimum current of oscillation. This data is once stored in the register 610 due to a WRITE signal 800 and delivered to the current-limiting resistive circuits 400 and 500 (refer to waveforms (L), (M), (N), (O), (P), (Q), (R) and (S) of FIG. 4B). Hereby, the P and N type FETs $P_2$, $P_3$ and $N_2$, $N_3$ are conducting, so that substantially 1.3 kΩ of combined resistance is connected between the source of the MOS FET P20 and the power source potential as well as between the source of the MOS FET N20 and ground potential.

Thereupon, an amplitude of the oscillation output signal from the CMOS inverter 200 is dropped from about 5 to about 3 V, for thereby enabling the whole oscillator to be operated with a low power consumption (see waveform (V) of FIG. 4B).

Successively, reaching a power-down mode in a phase S3 of the machine cycle M2 in which the microprocessor IC is made to stand by with a low power consumption, data 00000011, for example, is provided to the data bus 700, and is written in the register 610 by a WRITE signal 800 (refer to waveforms (L), (M), (N), (O), (P), (Q), (R) and (S) of FIG. 4B). Hereby, all of the MOS FETs arranged in the current limiting resistance circuits 400 and 500 are changed to a non-conduction state, whereby the oscillation is stopped.

Simultaneously, since data 00000000 is applied to an NOR circuit 632 of the inhibit circuit 630, the MOS FET 631 conducts, whereby an output part OUTPUT of the CMOS inverter 200 is fixed at the ground potential, and prevented from floating (refer to waveform (V) of FIG. 4B).

Then, operation of the CMOS crystal control oscillator of the present invention will be described with reference to the timing chart shown in FIG. 5 when a low frequency (e.g., 50 kHz) quartz element is connected between the terminals OSC 0 and OSC 1.

At the instant the 5 V supply voltage is applied to the microprocessor IC (refer to waveform (A) of FIG. 5A), outputs from the CPU internal data bus 700 and the register 610 are unstable. Applying here a CPU reset signal (not shown), a reset signal 900 becomes a "1", and the register 610 is initialized to 00000000 (refer to waveforms (L), (M), (N), (O), (P), (Q), (R) and (S) of FIG. 5B). Then, a "0" level logical signal is entered from the terminal 650, whereby the NOR circuit 653 causes the MOS FETs $P_5$ and $N_5$ to conduct due to an output signal therefrom. The CMOS inverter 200 is biased with a $V_{DD}/2$ voltage and gradually reaches a state of oscillation to deliver a 5 V clock signal (refer to waveform (V) of FIG. 5B).

In succession, in a phase S3 of the machine cycle M1, data 10010000, for example, is provided on the data bus 700 owing to a program instruction, and once stored in the register 610 by a WRITE signal 800 and delivered (refer to waveforms (L), (M), (N), (O), (P), (Q), (R) and (S) of FIG. 5B). Hereby, since the P and N type MOS FETs $P_8$ and $N_8$ of the current limiting circuit are conducting, substantially 80 kΩ resistance is connected between the source of the MOS FET P20 and the power source potential $V_{CC}$, and between the source of the MOS FET N20 and the ground potential.

Hereby, the CMOS inverter 200 delivers an amplitude of the oscillating output signal which is dropped from 5 to 3 V, and thus can operate with low power consumption (refer to waveform (V) of FIG. 5B).

Then, to operate the microprocessor IC in a power-down mode in the phase S3 of the machine cycle M2 in which it is made to stand by with a low power consumption, data 00010000 is delivered on the data bus 700 by a program instruction, and written in the register 610 by the WRITE signal 800 (refer to waveforms (L), (M), (N), (O), (P), (Q), (R) and (S of FIG. 5B).

Hereby, all the MOS FETs of the current-limiting resistive circuits 400 and 500 are brought in a non-conduction state to interrupt the oscillation operation. Simultaneously, since data 00000000 is entered to the NOR circuit 632 of the inhibit circuit 630, the MOS FET 631 is conducting, whereby the output part OUTPUT of the CMOS inverter is fixed at the ground potential and thus prevented from floating.

With the CMOS crystal controlled oscillator according to the present invention, as described above, an oscillation condition can be adjusted to its optimum parameters under a program control. Accordingly, it is possible to operate it with low power consumption over a wide frequency range as well as improve its start-up characteristics. With the development of highly integrated microprocessor ICs in recent years, a rate of consumed power in an oscillator circuit to that in the whole electronic system is increased. Thus, the oscillator circuit according to the present invention is advantageous to satisfy this need. The crystal control oscillator of the present invention is suitable for a clock source for microprocessors and the microcomputers.

Although a certain preferred embodiment has been shown and described, it should be understood that many changes and modifications may be made therein without departing from the scope of the appended claims.

What is claimed is:

1. A CMOS crystal controlled oscillator for use in a semiconductor device having an internal data bus comprising:
    (a) a CMOS inverter composed of P and N type MOS FETs which are connected in series with each other;
    (b) a crystal element connected between signal input and output nodes of said CMOS inverter;
    (c) a first capacitor connected between said signal input node of said CMOS inverter and a ground potential;
    (d) a second capacitor connected between said signal output node of said CMOS inverter and said ground potential;
    (e) a feedback resistor connected between the signal input and output nodes of said CMOS inverter for providing a DC bias potential to said CMOS inverter;
    (f) a first current-limiting circuit connected between the P type MOS FET of said CMOS inverter and a power source potential for limiting a current through said CMOS inverter; said first current-limiting circuit comprising a plurality of P type MOS FETs which are connected in parallel;
    (g) a second current-limiting circuit connected between said N type MOS FET of said CMOS inverter and said ground potential for limiting a current flowing through said CMOS inverter; said second current-limiting circuit comprising a plurality of N type MOS FETs which are connected in parallel; and
    (h) a control register for controlling said first and second current-limiting circuits based on data on said internal data bus to reduce power consumption of said crystal control oscillator; wherein said plurality of P type MOS FETs are controlled selectively in response to data from said control register and wherein said plurality of N type MOS FETs are controlled selectively in response to data from said control register.

2. A CMOS crystal control oscillator according to claim 1, further including a means connected between the output of said CMOS inverter and the output of said control register for preventing the output of said CMOS from being electrically floating when said P and N type MOS FETs of said CMOS inverter are in an off condition.

3. A CMOS crystal control oscillator according to claim 2, wherein said electrically floating preventing means comprises a MOS FET and a NOR circuit.

4. A CMOS crystal control oscillator according to claim 2, further including a control means connected between said first and second current-limiting circuits and said control register for selectively causing conduction of predetermined MOS FETs in response to an external control signal, thereby improving its oscillation starting time.

5. A CMOS crystal control oscillator according to claim 4, wherein said control means comprises a NOR circuit.

* * * * *